United States Patent [19]

Davis et al.

[11] Patent Number: 4,912,063
[45] Date of Patent: Mar. 27, 1990

[54] GROWTH OF BETA-SIC THIN FILMS AND SEMICONDUCTOR DEVICES FABRICATED THEREON

[75] Inventors: Robert F. Davis; Hua-Shuang Kong, both of Raleigh; Jeffrey T. Glass, Apex; Calvin H. Carter, Jr., Raleigh, all of N.C.

[73] Assignee: North Carolina State University, Raleigh, N.C.

[21] Appl. No.: 113,921

[22] Filed: Oct. 26, 1987

[51] Int. Cl.$^4$ .............................................. H01L 21/20
[52] U.S. Cl. ................................... 437/100; 437/105; 437/106; 148/DIG. 148; 156/610; 156/DIG. 64
[58] Field of Search ............... 437/100, 105, 106, 949, 437/970; 148/DIG. 148; 156/610, DIG. 64

[56] References Cited

U.S. PATENT DOCUMENTS 2,854,364  9/1958  Lely ..................................... 437/100

FOREIGN PATENT DOCUMENTS

| 2159592 | 6/1973 | France ................................ 437/100 |
| 2030699 | 2/1987 | Japan ................................. 437/100 |
| 1031783 | 6/1966 | United Kingdom ................ 437/100 |
| 1039748 | 8/1966 | United Kingdom ................ 437/100 |
| 1054519 | 1/1967 | United Kingdom ................ 437/100 |

OTHER PUBLICATIONS

Kong et al., "Epitaxial Growth of β-SiC Thin Films on 6H α-SiC Substrates via Chemical Vapor Deposition", Appl. Phys. Lett., vol. 49, No. 17, Oct. 27, 1986, pp. 1074–1076.
Kuroda et al., "Step-Controlled VPE Growth of SiC Single Crystals at Low Temperatures", Extended Abstracts of the 19th Conference on Solid State Devices and Materials", Tokyo, Aug. 25–27, 1987, pp. 227–230.
Shibahara et al., "Surface Morphology of Cubic SiC(100) Grown on Si(100) by Chemical Vapor Deposition", J. of Crystal Growth, vol. 78, 1986, pp. 538–544.
Powell et al., "Improved β–SiC Heteroepitaxial Films using Off-Axis Si Substrates", Appl. Phys. Lett., vol. 51, No. 11, Sep. 14, 1987, pp. 823–825.
Saidov et al., "Current–voltage Characteristics of Silicon Carbide Heterojunctions", Sov. Phys. Semicond., vol. 13, No. 9, Sep. 1979, pp. 1054–1056.
Pilyankevich et al., "Change in Real Structure During the B→α SiC Conversion", Izv. Akad. Nauk. SSSR Neorg. Mater., vol. 19, No. 10, Oct. 1983, pp. 1557–1559.
Kong et al., "The Effect of Off-Axis Si(100) Substrates on the Defect Structure and Electrical Properties of β–SiC Thin Films", J. Mater. Res., vol. 3, No. 3, May/Jun. 1988, pp. 521–530.
Kong et al., "Growth Rate, Surface Morphology and Defect Microstructures of β–SiC Films Chemically Vapor Deposited on 6-H-SiC Substrates", J. Mater. Res., vol. 4, No. 1, Jan./Feb. 1989, pp. 204–214.
Furumura et al., "Characteristics of β–SiC Films Grown from an SiHCl$_3$–C$_3$H$_8$–H$_2$ System", Electronics and Communications in Japan, Part 2, vol. 70, No. 5, 1987, pp. 53–63.
Palmour et al., "High Temperature Depletion-Mode Metal-Oxide-Semiconductor Field-Effect Transistors in Beta-SiC Thin Films", Appl. Phys. Lett., vol. 51, No. 24. Dec. 14, 1987, pp. 2028–2030.
Shibahara et al., "Antiphase-Domain-Free Growth of Cubic SiC on Si(100)", Appl. Phys. Lett., vol. 50, No. 26, Jun. 29, 1987, pp. 1888–1890.
Palmour et al., "Characterization of Device Parameters in High-Temperature Metal-Oxide-Semiconductor Field-Effect Transistors in β–SiC Films", J. Appl. Phys., vol. 64, No. 4, Aug. 15, 1988, pp. 2168–2177.
Zheng et al., "Scanning Tunneling Microscopy of Cubic Silicon Carbide Surfaces", J. Vac. Sci. Technol. A, vol. 6, No. 3, May/Jun. 1988, pp. 696–698.
(List continued on next page.)

Primary Examiner—Brian E. Hearn
Assistant Examiner—M. Wilczewski
Attorney, Agent, or Firm—Bell, Seltzer, Park & Gibson

[57] ABSTRACT

Device quality thin films of Beta-SiC are epitaxially grown on substrates of Alpha-Sic.

14 Claims, 6 Drawing Sheets

OTHER PUBLICATIONS

Liaw et al., "Epitaxial Growth and Characterization of β-SiC Thin Films", *J. Electrochem. Soc.*, vol. 132, No. 3, pp. 642-648.

Will et al., "Improved Epitaxial Process for Fabricating Silicon Carbide Semiconductor Devices", *Solid State Technol.*, Apr. 1975, vol. 18, No. 4, p. 70.

Powell et al., "Improved β-SiC Heteroepitaxial Films Using Off-Axis Si Substrates", *Appl. Phys. Lett.*, vol. 51, No. 11, Sept. 14, 1987, pp. 823-825.

Shibahara et al., "Inversion-Type N-Channel MOSFET Using Antiphase-Domain Free Cubic-SiC Grown on Si(100)", Extended Abstracts of the 18th Conf. on Solid State Devices and Materials, Tokyo, 1986, pp. 717-718.

Kong et al., "Growth and Characterization of Chemically Vapor Deposited Beta-SiC Epilayers on 6H Alpha-SiC Substrates", Mat. Res. Soc. Proc., vol. 77, *Interfaces, Superlattices and Thin Films Symposium*, pp. 405-410, 1987, (9/11/87).

Kong et al., "Growth, Doping, Device Development and Characterization of CVD Beta-SiC Epilayers on Si(100) and Alpha-SiC(0001)", Mat. Res. Soc. Symp. Proc., vol. 97, Novel Refract. Semicond., 1987, pp. 233-245, (9/11/87).

Materials Research Society; 1986 Fall Meeting; Final Program and Abstracts; p. 186.

Wessels, B., Gatos., H. C., and Witt, A. F., "Epitaxial Growth of Silicon Carbide by Chemical Deposition", *Silicon Carbide, p. 25, (1974).*

Nishino, S., Matsunami, H. and Tanaka, T., "Growth and Morphology of 6H-SiC Epitaxial Layers by CVD", *J. Crystal Growth*, 144, (1978).

Muench, W. V. and I. Pfaffeneder, "Epitaxial Deposition of Silicon Carbide from Silicon Tetrachloride and Hexane", *Thin Solid Films*, 31, 39, (1976).

Powell., J. A., and Will, H. A., "Epitaxial Growth of 6H SiC in the Temperature Range 1320-1390 C", *J. Appl. Phys.*, 44, 177, (1973).

Bartlett, R. W. and R. H. Mueller, "Epitaxial Growth of β-Silicon Carbide", *Material Res Bull* 4, 5341, (1969).

Kahn, I. H., "The Epitaxial Growth of Beta Silicon Carbide", *Material Res Bull,* 4, 5285, (1969).

Yoshida, S., E. Sakuma, S. Misawa and S. Gonda, "A New Doping Method Using Metalorganics in Chemical Vapor Deposition of 6H-SiC", *J. Appl. Phys.*, 55 (1) 169, (1984).

Minagwa, S. and H. C. Gatos, "Epitaxial Growth of α-SiC From The Vapor Phase", *Japanese J. of Applied Phys.*, 10 (12), 1680, (1971).

Jennings., V. J., A. Sommer and H. C. Chang, "The Epitaxial Growth of Silicon Carbide", *J. Electrochem. Soc.*, 113 (7), 728, (1966).

Kuroda, N., K. Shibahara, W. S. Yoo, S. Nishino and H. Matsunami "Homoepitaxial Growth of 6H-SiC at Low Temperatures", Abstracts of Spring Meeting of Appl. Phys. Society, 28 p-ZC-2, p. 35, (1987).

*Kuroda, N., K. Shibahara, W. S. Yoo, S. Nishino and H. Matsunami, "Homoepitaxial Growth of 6H-SiC at Low Temperatures", Abstracts of Spring Meeting of Appl. Phys. Society, 28 p-ZC-3, p. 35, (1987).*

H. J. Kim, S. Kong, J. A. Edmond, J. T. Glass and R. F. Davis, "Chemical Vapor Deposition, In Situ Doping and MESFET Performance of β-SiC Thin Films Submitted to Silicon Carbide Symposium, American Ceramic Soc, Aug. 2-5, 1986.

Callaghan, M. P. and R. W. Brander, "A New System for the Chemical Vapor Deposition of SiC", *J. Crystal Growth,* 13/14, 397, (1972).

Rai-Choudhury, P. and N. P. Formigoni, "β-Silicon Carbide Films", *J. Electrochem. Soc.* 116, 1440, (1969).

Berman, I., C. E. Ryan, R. C. Marshall and J. R. Littler, "The Infuence of Annealing on Thin Films of Beta SiC", *AFCRL-72-0737, 1972.*

GROWTH OF BETA-SIC THIN FILMS AND SEMICONDUCTOR DEVICES FABRICATED THEREON

FIELD OF THE INVENTION

The invention relates to the growth of high quality Beta-SiC thin films of a type suitable for semiconductor device applications. More particularly, the invention relates to Beta-SiC monocrystalline thin films which are expitaxially grown via chemical vapor deposition on Alpha-SiC substrates.

BACKGROUND

Silicon carbide is the only compound species in the Si-C system, but it can occur in many polytype structures. The lone cubic polytype crystallizes in the zinc blended structure and is denoted "Beta-SiC." The approximately one hundred seventy known additional hexagonal and rhombohedral polytypes are collectively referred to as "Alpha-SiC."

Beta-SiC has been long considered as an excellent candidate semiconductor material for high-temperature, high-power and high-speed device applications due to its unique physical and electronic properties of high melting point, high thermal conductivity, wide band gap, high breakdown electric field and high saturated electron drift velocity. The high thermal conductivity and breakdown field also indicate that high device densities can be achieved utilizing Beta-SiC. Unfortunately, early research on the use of Beta-Sic as a semiconductor was hindered by the difficulty of the reproducible growth of high quality crystals.

In recent years Beta-SiC has been actively studied because crack-free, reproducible monocrystalline Beta-SiC films have been obtained on Si(100) substrates by chemical vapor deposition (CVD). However, analysis of these films by means such as cross-sectional transmission electron microscopy (XTEM) has revealed a high density of defects, mainly stacking faults and the partial dislocations that bound them, at the Si substrate/Beta-SiC interface. A majority of these defects extend at least 3 μm into the film, but many extended to the as-grown surface (up to 20 μm). These defects occurred primarily as a result of the lattice mismatch (~20%) and the thermal expansion mismatch (~8%) between the two materials. They cause unacceptable charge carrier redistribution and the introduction via diffusion of impurity dopants from the Beta-SiC film into the Si substrate. It is also probable that these defects reduce the carrier mobilities and lead to large leakage currents. Thus, it is clear that it would be very advantageous to find a substrate more closely matched to SiC in both lattice parameter and thermal expansion than Si.

The growth of SiC on SiC substrates via chemical vapor deposition has been reported since the late 1960's. Several researchers have reported on the growth of Alpha-SiC on Alpha-SiC substrates in the temperature ranges 1500°–1760° C. and 1320°–1390° C. with growth directions parallel to the [0001] axis and perpendicular to the [0001] axis, respectively. A few researchers also reported the growth of extremely thin Beta-SiC films on Alpha-SiC substrates in the temperature range of 1500°–1700° C. and the growth of Beta-SiC on Beta-SiC substrates in the temperature range of 1200°–1800° C. In some cases, the investigators reported the achievement of single-crystal Beta-SiC epilayers. The SiC epilayers and the SiC substrates were not analyzed by techniques capable of noting the defects that were, in fact, formed in the bulk thin films, or at the interfaces Nor were studies undertaken to establish the utility of these films for commercial device applications.

SUMMARY OF THE INVENTION

Recent research into the rapid growth of high purity, bulk Alpha-SiC crystals via sublimation methods appears promising. Therefore, in anticipation of increased availability of bulk Alpha-SiC in the near future, the work leading to the present invention was undertaken to ascertain the feasibility of using wafers formed from such material as substrates for the CVD of Beta-SiC thin films. Thus, the present invention is concerned with obtaining high quality Beta-SiC thin films grown on Alpha-SiC substrates, examines the Beta-SiC/Alpha SiC interface via cross-sectional transmission electron microscopy (XTEM) and transmission electron diffraction (TED), and determines the suitability of the produced Beta-SiC films for commercial device applications.

In one aspect, the invention may be defined as a silicon carbide semiconductor product useful for the fabrication of semiconductor devices which will operate at high powers, high frequencies, high radiation densities, and temperatures over 500° C., wherein the product comprises (i) a 6H SiC substrate and (ii) a Beta-SiC thin film epitaxially deposited in the [111]growth direction on the (0001)Si face of the 6H SiC substrate such that the (111) crystallography of the Beta-SiC thin film matches the (0001) crystallography of the 6H SiC substrate and such that the Beta-SiC (101) face is parallel to the 6H SiC (1120) face and the Beta-SiC (111) face is parallel to the 6H SiC (0001) face. Products of this type are characterized by a coherent Beta-SiC/6H SiC interface and a low, device compatible defect density within the bulk Beta-SiC film. Similar devices may be grown on the (0001)C face of a substrate.

In another aspect, the invention may be defined as a method of producing an electrical grade film of monocrystalline Beta-SiC on an Alpha-SiC substrate comprising the following steps: (i) polishing a crystal of Alpha-SiC along a basal plane thereof to level its surface; (ii) oxidizing the polished surface of the Alpha-SiC substrate crystal; (iii) removing the oxidized layer from the remainder of the silicon carbide substrate crystal; (iv) introducing the substrate crystal into a CVD system and etching the substrate with a flowing stream of hydrogen gas at a temperature sufficient to remove any native oxide layer thereon; and (v) epitaxially depositing a film of Beta-SiC on the substrate by introducing a vaporized, silicon-containing material and a vaporized carbon-containing material into the flowing stream of hydrogen gas, while introducing sufficient energy to insure sufficient decomposition of said silicon-and carbon-containing materials into silicon and carbon species and to insure sufficient surface diffusion of the silicon species and carbon species at the substrate surface to produce monocrystalline growth of Beta-SiC, but said introduced energy being less than the energy required to form Alpha-Sic.

BRIEF DESCRIPTION OF THE DRAWINGS

FIG. 3(a) illustrates the surface morphology achieved by a ($SiH_4$+$C_2H_4$) gas flow ratio to that of the $H_2$ carrier gas of 3:3000. FIG. 3(b) shows the surface morphology corresponding to a flow ratio of 1.5:3000. FIG. 3(c) shows the surface morphology corresponding to the flow ratio of 1:3000.

FIG. 4 also includes in the upper corner thereof three transmission electron diffraction (TED) patterns which show respectively (1) a 6H SiC [1120] pole diffraction pattern taken from the substrate, (2) a diffraction pattern taken from the Beta-SiC/6H SiC interface region, and (3) a Beta-SiC [101] pole diffraction pattern taken from the epilayer.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

The present invention concerns a novel technology that permits the growth of commercially useful Beta-SiC thin films that are coherent with Alpha-SiC substrates and demonstrate low, device-compatible defect densities within the bulk Beta-SiC film. In a related development, device quality Alpha-SiC films have been grown on off-axis Alpha-SiC substrates, as described in commonly assigned application Ser. No. 113573, filed concurrently herewith entitled "Homoepitaxial Growth of Alpha-SiC Thin Films and Semiconductor Devices Fabricated Thereon," inventors, Davis, Kong and Glass, incorporated herein by reference.

The Alpha-SiC substrate crystals utilized in the examples set forth below are of three origins. First are industrial 6H SiC crystals obtained from an Acheson furnace. These crystals have mirror-like surfaces and are black, indicating high impurity content. The second type of crystal takes the form of 6H SiC crystals obtained from an unseeded Lely sublimation process. These crystals are substantially clear, indicating relatively high purity. The third type of crystals are 6H SiC crystals obtained from a novel seeded sublimation technique recently developed at North Carolina State University, Raleigh, N.C. This new technique produces very high quality, bulk single crystals which may be sliced into wafers, with the wafers being used as 6H SiC substrates for the present invention. This sublimation process and the bulk single crystals grown therein are described in commonly assigned, copending application Ser. No. 112565, filed on even date herewith, entitled "Sublimation of Silicon Carbide To Produce Large Device Quality Single Crystals Of Silicon Carbide," inventors Davis, Carter and Hunter.

The black substrates from the Acheson furnace were used primarily for the growth of films which were studied with respect to growth rate, surface morphology and film defects. The relatively clear, clean substrates were used for the growth of films for which electronic property measurements were made.

It will be appreciated that the 6H SiC substrate materials are polar in nature and therefore present two basal planes, the (0001)Si face and the (0001)C face, both of which may be utilized as substrate growth surfaces according to the present invention.

EXAMPLE 1

Figure 1:
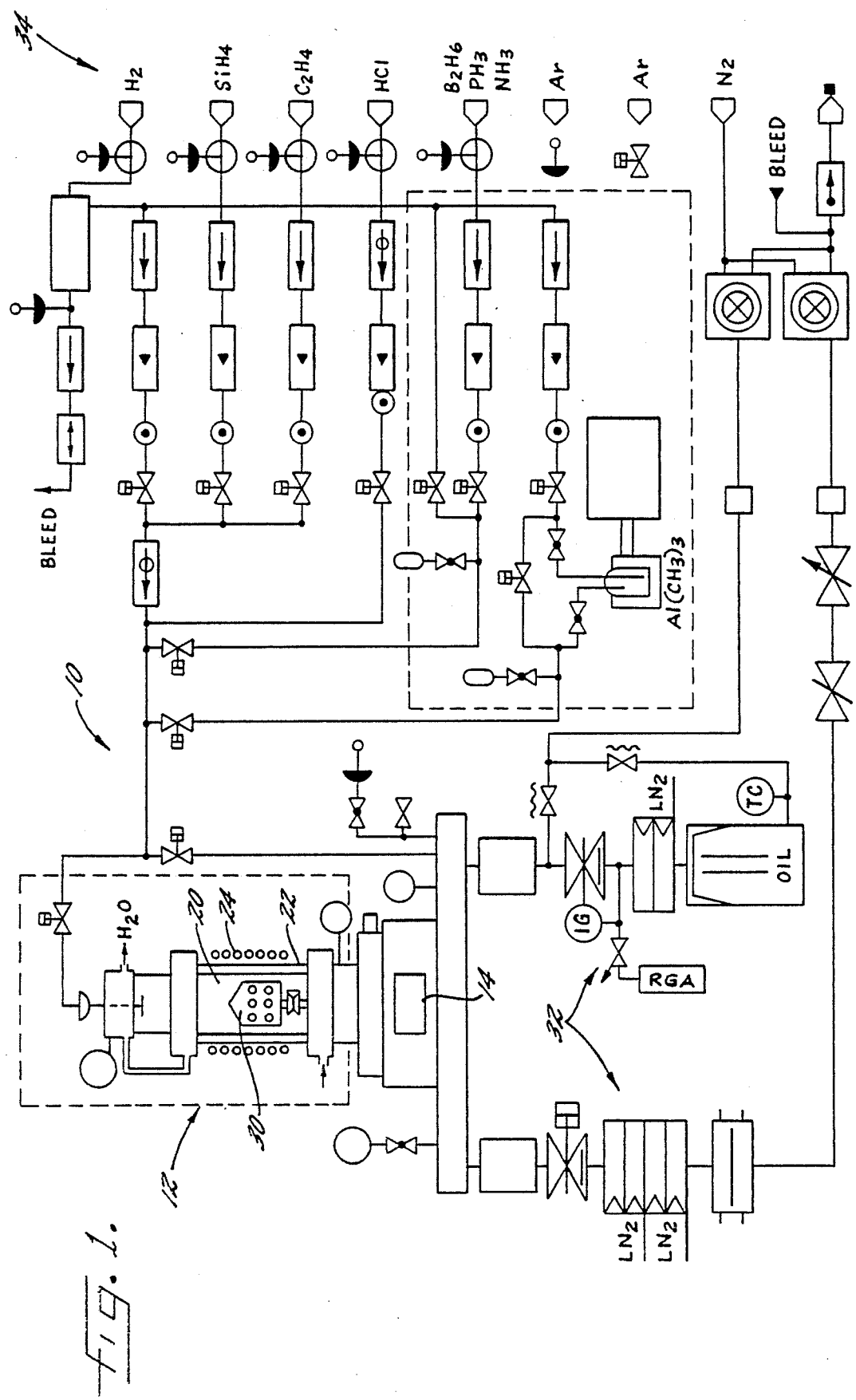
FIG. 1 is a schematic diagram of the CYD system employed for the growth and doping of monocrystalline Beta-SiC thin films in accordance with the present invention.

A 6H SiC crystal from an Acheson furnace was selected as the substrate material. The crystal as recovered from the furnace had a mirror-like surface at the (0001)Si face and, therefore, did not require polishing. In order to prepare the substrate crystal for CYD growth, the (0001) Si face was oxidized at 1200° C. in a flow of dry oxygen for 1.5 hours in order to oxidize to a depth of approximately 500 Å from the surface. The resulting oxide layer was removed by immersion in a 49% concentration hydrofluoric acid. The substrate was then rinsed in deionized water, thereby putting the substrate in a prepared condition (i.e. prepared to be receptive to epitaxial growth thereon) rendering the substrate ready for loading into the CVD system 10, which is schematically depicted in FIG. 1.

Prior to proceeding with a description of the CYD processing, a brief description of CYD system 10 will be given, with the understanding that a more detailed description of a substantially similar system is contained in the cataloged doctoral thesis of Hyeong Joon Kim, Entitled "Epitaxial Growth, Doping and Characterization of Monocrystalline Beta Silicon Carbide Thin Films and Fabrication of Electronic Devices," 1985, Department of Materials Engineering, North Carolina State University, Raleigh, North Carolina, incorporated herein by reference.

CYD system 10 includes a main reactor portion 12 having a loading chamber 14 which communicates with the CVD growth chamber 20. The sides of growth chamber 20 are defined by a quartz tube 22. Heat is supplied to the growth chamber 20 by means of an RF induction coil 24. Substrates are loaded into system 10 on a SiC-coated graphite susceptor 30.

Pressure within growth chamber 20 is controlled by a pressure control system which is referred to generally by reference numeral 32. The gas supply systems are denoted by the reference numeral 34. Systems 32 and 34, and certain other components of CVD system 10, are not described in detail herein, but a complete description is contained in the thesis referred to above.

The substrate crystal which has been prepared for epitaxial growth thereon, preferably by the oxidation and etching steps discussed above, is placed on the SiC-coated graphite susceptor 30 and then loaded into the loading chamber 14 of system 10. The susceptor is next moved upwardly into growth chamber 20, which is the susceptor position illustrated in FIG. 1.

Following positioning the susceptor and substrate in the growth chamber, the growth chamber is evacuated to at least $10^{-4}$ Torr, with an evacuation to $10^{-5}$ Torr being used in this example. Evacuation is achieved by the pressure control system 32 which includes a suitable pump, such as a diffusion pump or turbomolecular pump. Next the growth chamber is backfilled for 10 minutes with pure $H_2$ at a 3 liters/minute flow rate to 760 Torr in order to purge the system. Preferably the $H_2$ is purified to a purity well in excess of 99.99 purity prior to introduction into the CVD system. This enhanced purity of the $H_2$ gas may be accomplished by known Pd-Ag purification techniques.

Figure 2:
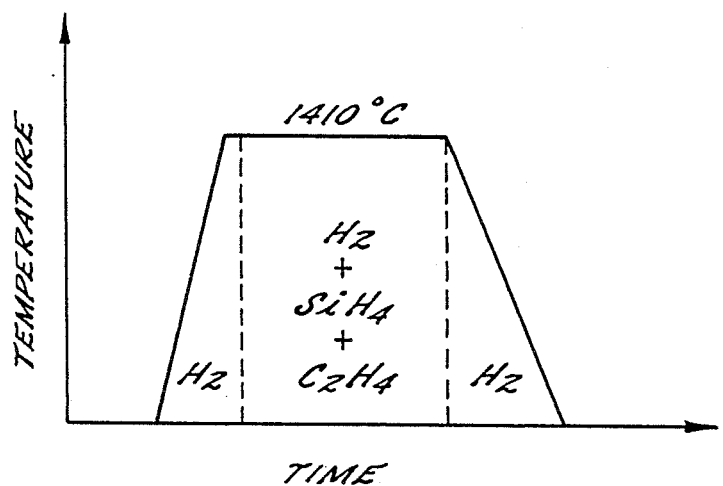
FIG. 2 is a schematic diagram illustrating the growth sequence employed for the growth of Beta-SiC thin films on Alpha-SiC substrates in accordance with the procedure of Examples 1 and 2.

Following the purging step, the $H_2$ gas flow is continued while RF induction coil 24 heats the growth chamber to a growth temperature of approximately 1410° C., a temperature within the preferred operational range of about 1400° C. to about 1600° C. (The temperature sequence for the deposition is shown in FIG. 2). Once the growth temperature is attained, it is held while the $H_2$ gas flow continues for a period of time sufficient to etch away any native oxide layer on the substrate surface. An $H_2$ etching period of 10 minutes has been found to be sufficient to etch away approximately 10 Å.

With the etching complete, the $H_2$ gas flow continues, serving as the carrier gas for the growth process. A vaporized silicon containing material in the form of a silicon source gas, $SiH_4$ (silane), and a vaporized carbon containing material in the form of a carbon source gas, $C_2H_2$ (ethylene), are introduced into the growth chamber with the carrier gas. The ratio of the sum of $SiH_4$ and $C_2H_4$ flow rates to the flow rate of $H_2$ was varied from 3:3000 to 1:3000 (sccm/sccm). The $SiH_4/C_2H_4$ flow rate ratio was maintained at two. Preferably the source gases are of very high purity, with the silane containing less than 2 ppm nitrogen impurities and the ethylene containing less than 10 ppm nitrogen impurities. The pressure in the growth chamber is held steady at approximately 760 Torr.

Following a CVD growth period on the order of 3 to 4 hours, RF heater 24 was turned off and the flow of source gases was discontinued. The $H_2$ gas flow was allowed to continue for the first 10 minutes of the cool down period. The cool down period then continued for a total of about 2 hours. The growth chamber was then filled with argon gas to 760 Torr, followed by removal of susceptor 30 and the substrate/thin film product Throughout the growth period the temperature, pressure and gas flows were maintained constant (i.e. without substantial fluctuations) in order to encourage consistent growth of a quality monocrystalline film.

EXAMPLE 2

The process of Example 1 was carried out with the only change being that growth of the thin film occurred on the (0001)C face of the substrate instead of the (0001) Si face.

EXAMPLE 3

A process substantially the same as that of Example 1 was carried out utilizing 6H SiC crystals obtained from an unseeded Lely sublimation process Film growth was accomplished on both the (0001)Si face and the (0001)C face. These faces were first polished with a diamond paste in order to provide a planar, smooth surface. The polishing step was followed by the oxidizing and etching steps described in Example 1.

EXAMPLE 4

Examples 1, 2 and 3 were repeated utilizing growth temperatures of 1450° C., 1500° C. and 1550° C.

EXAMPLE 5

Thin films grown in accordance with the process of Examples 1-4 may be doped in order to achieve p-and n-type layers in the Beta-SiC films The p- and n-type dopants of Al and B (Group III), and N and P (Group Y), respectively, may be incorporated into the films directly during growth. This was accomplished by introducing $Al(CH_3)_3$, $B_2H_6$, $N_2$ (or $NH_3$) and $PH_3$ directly into the primary gas stream, in the case of $Al(CH_3)_3$.

The films obtained by the processes of all examples were Beta-SiC, as determined by transmission electron microscopy (TEM), discussed below.

The film growth rates achieved under Example 2 as determined from thickness measurements were 1.67, 1.16, and 0.35 $\mu$m/h using the source gases to carrier flow ratios of 3:3000, 1.5:3000, and 1:3000, respectively for the growth temperature of 1410° C. (Studies showed that growth rate increases substantially linearly with increases in the gas flow ratio.) The effect of altering this ratio on the Beta-SiC surface morphology of the thin films grown on the (0001)C face of a 6H SiC wafer is shown in the optical micrographs in FIGS. 3(a), 3(b) and 3(c). (Similar microstructures, but somewhat smoother, were found on the surfaces of the films grown on the (0001) Si face; however, the growth rates on the (0001)C face were somewhat higher.)

Figure 3A:
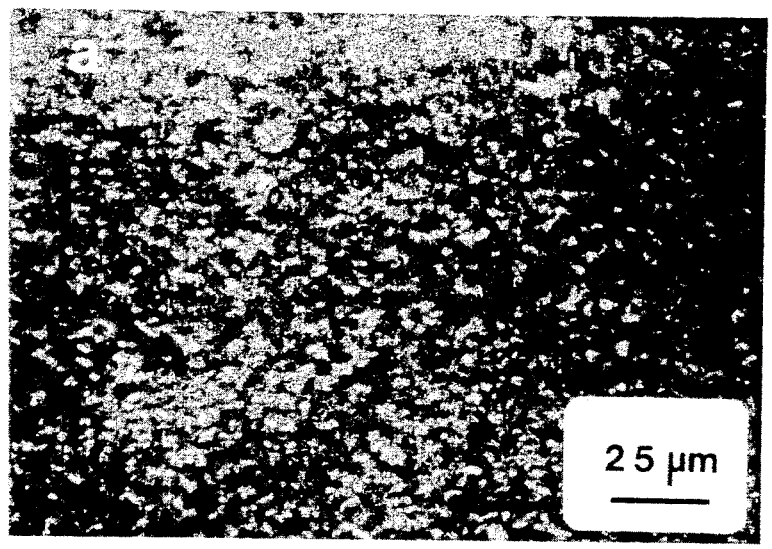
FIGS. 3(a), 3(b) and 3(c) are optical micrographs of surface morphologies of Beta-SiC films grown on the (0001)C face of 6H SiC wafers at 1410° C.
Figure 3B:
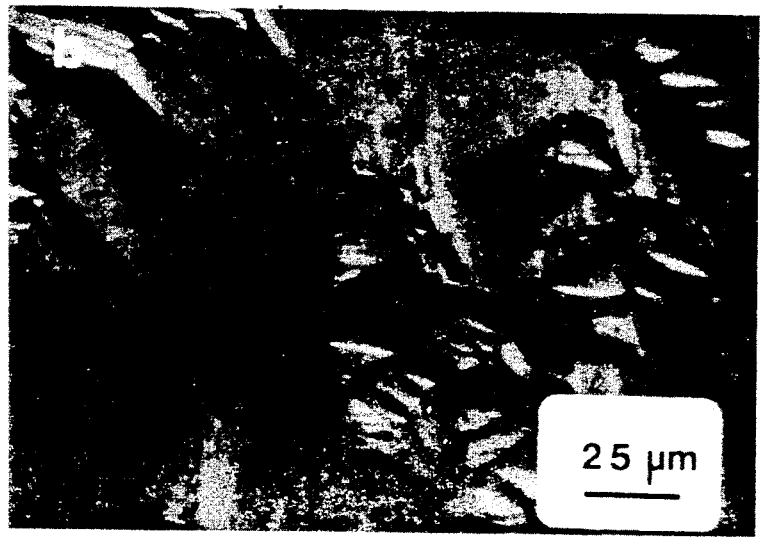
Figure 3C:
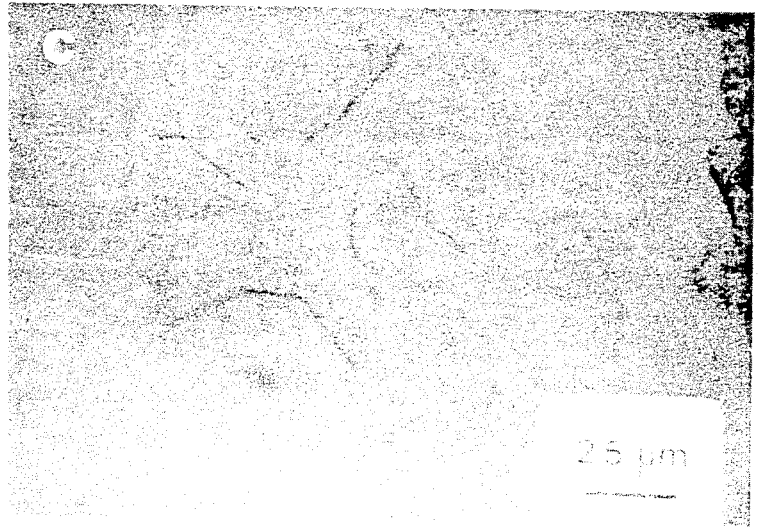

Referring to FIG. 3(a), the flow ratio of 3:3000 resulted in a polycrystalline film having a very rough surface. In this case, during the initial growth stage, a high density of nuclei having different orientations formed, grew, and impinged to produce a textured polycrystalline film. When the flow ratio was decreased to 1.5:3000, monocrystalline films having a pyramidal surface morphology formed (see FIG. 3 (b)). Although epitaxial growth was observed, the concentrations of the reactive gases were sufficiently high to yield a moderate density of critical nuclei. The close proximity of the growth pyramids limited the surface migration of adatoms between the pyramids This decreased the lateral growth rate, and vertical growth dominate. At the lowest source/carrier gas ratio, 1:3000, sufficient time was available for the formation of smooth flat growth steps on the final surface, as shown in FIG. 3(c). The small number of critical nuclei allowed enhanced lateral growth of the film.

It will be appreciated that the growth temperature maintained in the growth chamber of the CVD system was selected to introduce sufficient energy to insure sufficient decomposition of the silicon and carbon source gases into silicon and carbon species and to insure sufficient surface diffusion of the silicon and carbon species at the substrate surface to produce monocrystalline Beta-SiC, but the introduced energy being less than the energy required to form Alpha-SiC. In this regard, it will also be appreciated that the growth chamber may be heated by means other than an RF heater, for example, by DC hot wall (resistance) heating, quartz halogen, tungsten halogen or other light sources, or laser. Also, remote or immersed plasma assisted CVD may be utilized in the process of the invention. Lastly, energy may be introduced into the growth chamber and focused at the substrate surface by laser light of a frequency and energy to assist in the diffusion of the silicon and carbon species.

IDENTIFICATION AND CHARACTERIZATION OF EPILAYER AND EPILAYER/SUBSTRATE INTERFACE BY CROSS SECTIONAL TRANSMISSION ELECTRON MICROSCOPY (XTEM)

Figure 4:
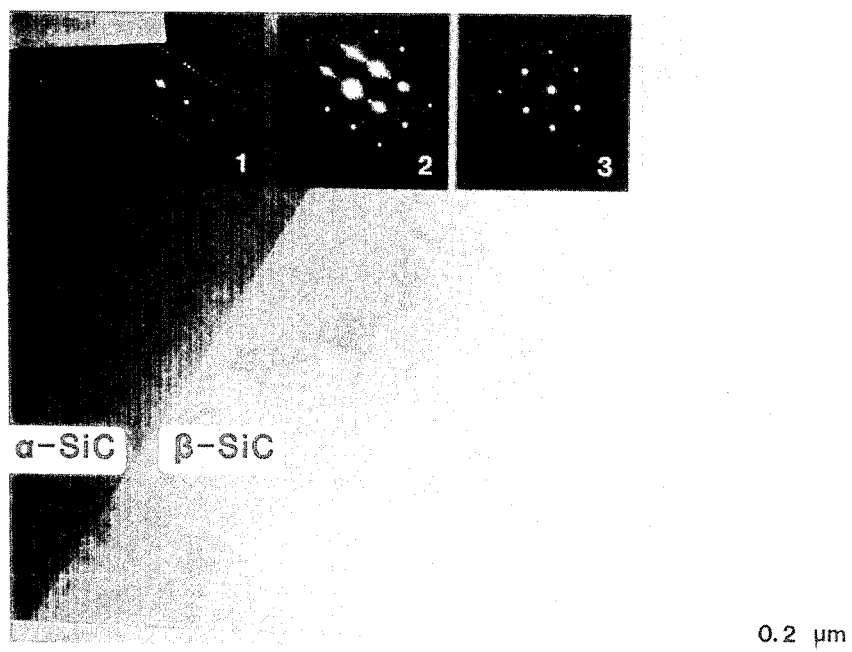
FIG. 4 is an XTEM micrograph of the Beta-SiC/6H SiC interface region of a sample grown in accordance with the present invention.

XTEM combined with transmission election diffraction (TED) was used to identify and characterize the microstructure of the epilayer and the epilayer/substrate interface region of specimens produced pursuant to Example 1, above, by growth on the (0001)C face. The results are shown in FIG. 4. Diffraction patterns noted #1 and #3, obtained from the substrate and the 1.2 $\mu$m thick epilayer, respectively, show reflections characteristic of the Beta-SiC [101] pole and the 6H-SiC [1120] pole Pattern #2, taken from the interface region, is a mixture of pattern #1 and #3 as a result of the overlap of the beam onto both parts of the sample. According to these patterns, the Beta-SiC (101) face is parallel to the 6H-SiC (1120) face and the Beta-SiC (111) face is parallel to the -6H-SiC (0001) face.

There were no line or planar defects observed in the photographs of FIG. 4. In fact, very few defects were observed in the entire XTEM sample and only one of them was generated from the Beta-SiC/Alpha-SiC interface. This is in strong contrast with epilayers grown on Si substrates which contain numerous defects at and near the interface over the entire XTEM sample. Therefore, it was concluded that the Beta-SiC/Alpha-SiC interface is nearly free of line and planar defects and that the defect density in the bulk epilayer is relatively low.

Figure 5:
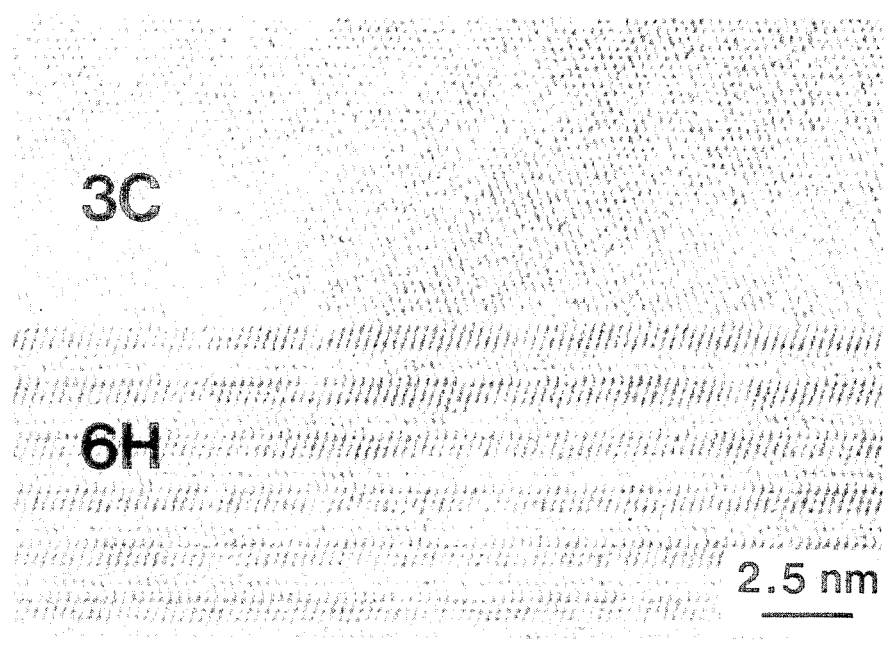
FIG. 5 is an HRTEM micrograph of the cross-section of the Beta-SiC/6H SiC interface region of one of the specimens grown in accordance with the present invention, and illustrating the coherent interface and the growth of the film in precisely the [111] direction.

In order to examine the coherent nature of the Beta-SiC/Alpha SiC interface, high resolution transmission electron microscopy (HRTEM) was used to image the lattice of another XTEM sample, as shown in FIG. 5. The electron beam was parallel to the [101] direction of the epilayer. A coherent interface can be clearly seen; the interface region is nearly perfect, even at this high magnification. One of the atomic layers runs completely across the interface which indicates that the growth direction of the Beta-SiC was exactly [111] in this region.

DOUBLE POSITIONING BOUNDARIES (DPB'S)

Although XTEM showed few defects generated from the Beta-SiC/Alpha-SiC interface, X-ray topography revealed the existence of relatively low levels of DPB's in Beta-SiC films. The DPB's appeared to correlate to surface morphology. However, as confirmed by analysis of the electronic properties of the films and the fabrication of devices thereon, the DPB's are of such a nature that the films are nevertheless of device quality. For purposes of this specification, the thin films of the invention, even when containing DPB's, are referred to as being "monocrystalline."

SECONDARY ION MASS SPECTROMETRY MEASUREMENT OF CONTAMINATION OF FILM BY IMPURITIES IN THE SUBSTRATE

Figure 6:
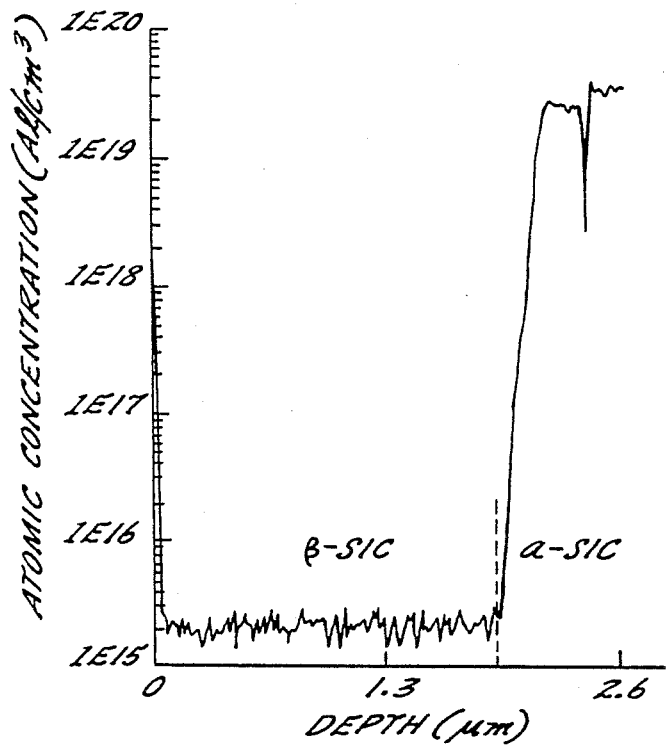
FIG. 6 is a SIMS profile showing a concentration of aluminum in both the Beta-SiC epilayer and a heavily Al doped 6H SiC substrate.

The impure, black, 6H-SiC substrates utilized in Examples 1 and 2 contained high concentrations of Al due to its addition during the Acheson process Therefore, to determine the amount of Al contamination of the Beta-SiC film which occurred as a result of the impure substrates, Al was analyzed as a function of depth into the sample using a CAMECA IMS-3F Ion Microprobe. Oxygen was used as the primary ion with a beam size of the 150 $\mu$m. The atomic concentration of Al was determined by comparing measured Al/Si ratios with a standard Al implanted Beta-SiC sample. The results are shown in FIG. 6. The Al atomic concentration in the substrate is $3\times10^{19}$ cm$^{-3}$, while that in the epilayer is only $2\times10^{15}$ cm$^{-3}$. The graph of FIG. 6 also shows that the drop in Al concentration from the substrate to the epilayer occurs over a very small depth. It indicates that there was almost no Al diffusion between the two layers. Therefore, it was shown that small amounts of impurities in the substrates will not seriously contaminate the epilayers under the growth conditions of the present invention. In fact, the small amount of aluminum existing in the epilayer may have been introduced from the gas stream, which could have been contaminated via out-diffusion from the substrate.

USE OF MILLER PROFILER TO MEASURE CARRIER CONCENTRATION AS A FUNCTION OF THE EPILAYER DEPTH

Figure 7:
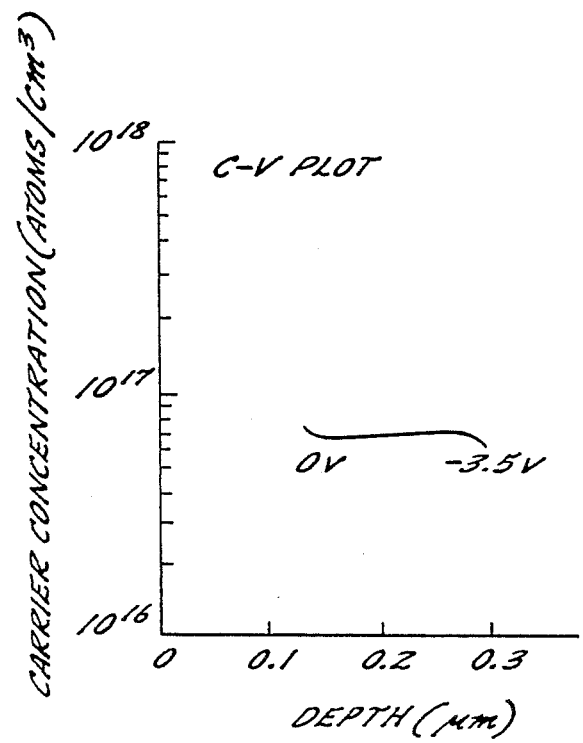
FIG. 7 is a graph of carrier concentration as a function of depth in a 7×8 mm by 4.5 μm thick unintentionally doped Beta-SiC film grown in accordance with the invention.

The concentration of active carriers and the distribution of these carriers as a function of depth in the Beta-SiC films were measured using a Miller Profiler In order to obtain a reproducible surface prior to this measurement, the Beta-SiC films produced by the process of Example 3 were initially polished with 0.1 $\mu$m diamond paste and subsequently oxidized and chemically etched to remove the subsurface polishing damage. A typical plot of carrier concentration vs. depth is shown in FIG. 7. As with unintentionally doped Beta-Sic films grown on Si (100) substrates, all samples measured were n-type, with carrier concentrations in the $10^{16}$ to $10^{17}$cm$^{-3}$ range The measured unintentionally doped carrier concentrations of less than $10^{17}$cm$^{-3}$ are within acceptable limits for rendering the films suitable for controlled doping in device applications.

ELECTRICAL CHARACTERISTICS OF AU-BETA-SIC SCHOTTKY DIODE FABRICATED ON A FILM OF THE INVENTION

Figure 8:
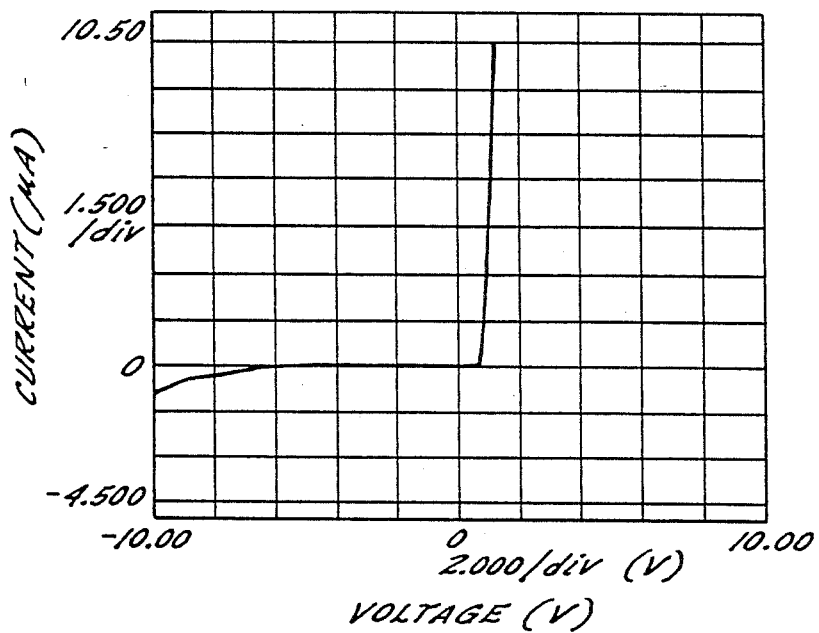
FIG. 8 illustrates the current-voltage characteristics of an Au-Beta-SiC Schottky diode fabricated on a thin film of the present invention.

An Au-Beta-SiC Schottky diode was made on an unintentionally doped Beta-SiC film grown on the (0001) Si face of an almost transparent (relatively pure) 6H-SiC substrate produced in accordance with Example 3, above. The Beta-SiC epilayer was 4 $\mu$m thick with a carrier concentration of $2\times10^{16}$ cm$^{-3}$. Thermally evaporated Au having an area of $1.4\times10^{-4}$ cm$^2$ was used as the rectifying contact. This contact was surrounded by a Au contact having an area of 0.36 cm$^2$ which served as an ohmic contact for the primary study. FIG. 8 shows the current-voltage curve of the fabricated Schottky diode. At the reverse bias of $-10$ volts, the leakage current is less than 1.5 $\mu$A.

The ideality factor, n, was determined to be 1.6 from the slope of the plot of log current vs. forward bias voltage. The saturation current, $J_s$, (obtained from the intersection of the straight line portion of this plot with the current axis) is $1.4 \times 10^{-11}$ A/cm$^2$. The barrier height for this Au-Beta-SiC Schottky diode was calculated from the following equation:

$$\phi_B = kT/q \ln(A^* T^2/J_s)$$

where $A^*$ is the effective Richardson constant $[A^* = m_n^*/m_o) \times A]$, kT is the thermal energy, and q is the electronic charge. Substituting the effective mass of the electron $m_n^* = 0.25 m_o$ and $A = 120$ amp/cm$^2$/K$^2$ into the above equation, the barrier height was calculated to be 1.03 eV. This is close to the reported values of 1.11 and 1.15 eV obtained from capacitance-voltage and the photoresponse measurements, respectively.

The production of this Schottky diode established the high quality of the Beta-SiC film, particularly the low, device quality defect level of the film and the quality of the interface that was formed between the film and the Au contacts.

METAL OXIDE SEMICONDUCTOR FIELD EFFECT TRANSISTOR (MOSFET) FORMED IN SILICON CARBIDE

High quality MOSFETs were fabricated on Beta-SiC thin films of the invention in accordance with procedures described in commonly assigned application Ser. No. 113564, filed concurrently herewith, entitled "Metal Oxide Semiconductor Field Effect Transistor Formed in Silicon Carbide," inventors Davis and Palmour, incorporated herein by reference. The MOSFET's stability and performance at temperatures in excess of 500° C. verified the device quality of the Beta-SiC thin films of the invention.

While the present invention has been described by reference to preferred embodiments and preferred process parameters, it will be appreciated that modifications may be made without departing from the true spirit and scope of the invention.

That which is claimed is:

1. A method of producing an electrical grade, high purity, low defect, epitaxially grown film of monocrystalline Beta-SiC on an Alpha-SiC substrate for use in semiconductor devices which will operate at high powers, high frequencies, high radiation densities, and temperatures over 500° C., the method comprising:

providing an Alpha-SiC crystal with a clean, planar, smooth surface along a basal plane thereof;

removing subsurface damage and/or chemical impurities from the surface of the basal plane; and epitaxially depositing a thin film of Beta-SiC on the planar surface of the substrate by introducing a vaporized, silicon-containing material and a vaporized carbon containing material into a flowing stream of carrier gas, wherein the substrate is an Alpha-SiC substrate and the basal plane thereof on which epitaxial growth occurs is the (0001)Si face, and wherein the Beta-SiC thin film is epitaxially deposited in the growth direction on the (0001) Si face of the Alpha-SiC substrate such that the (111) crystallography of the Beta-SiC thin film matches the (0001) crystallography of the Alpha-SiC substrate and such that the Beta-Sic (101) face is parallel to the Alpha-SiC (1120) face and the Beta-Sic (111) face is parallel to the Alpha-SiC (0001) face while introducing sufficient energy to insure sufficient decomposition of said silicon- and carbon-containing materials into silicon and carbon species and to insure sufficient surface diffusion of the silicon species and the carbon species at the substrate surface to produce monocrystalline growth of Beta-SiC, but said introduced energy being less than the energy required to form Alpha-Sic, and wherein the energy levels in the growth chamber and the source material to Carrier gas ratio are selected to produce a coherent, low defect Beta-SiC/AlphaSiC interface and a low, device-compatible defect density within the bulk Beta-SiC film.

2. A method of producing an electrical grade, high purity, low defect, epitaxially grown film of monocrystalline Beta-SiC on an Alpha-SiC substrate for use in semiconductor devices which will operate at high powers, high frequencies, high radiation densities, and temperatures over 500° C., the method comprising:

providing an Alpha-SiC crystal with a clean, planar, smooth surface along a basal plane thereof;

removing subsurface damage and/or chemical impurities from the surface of the basal plane; and epitaxially depositing a thin film of Beta-SiC on the planar surface of the substrate by introducing a vaporized, silicon-containing material and a vaporized carbon-containing material into a flowing stream of carrier gas, wherein the substrate is an Alpha-SiC substrate and the basal plane thereof on which epitaxial growth occurs is the (0001)C face, and wherein the Beta-SiC thin film is epitaxially deposited in the growth direction on the (0001)C face of the Alpha-SiC substrate such that the (111) crystallography of the Beta-SiC thin film matches the (0001) crystallography of the Alpha-SiC substrate and such that the Beta-SiC (101) face is parallel to the Alpha-SiC (1120) face and the Beta-Sic (111) face is parallel to the Alpha-SiC (0001) face while introducing sufficient energy to insure sufficient decomposition of said silicon- and carbon-containing materials into silicon and carbon species and to insure sufficient surface diffusion of the silicon species and the carbon species at the substrate surface to produce monocrystalline growth of Beta-SiC, but said introduced energy being less than the energy required to form Alpha SiC, and wherein the energy levels in the growth chamber and the source material to carrier gas ratio are selected to produce a coherent, low defect Beta-SiC/Alpha-SiC interface and a low, device-compatible defect density within the bulk Beta-Sic film.

3. A method of producing an electrical grade, high purity, low defect, epitaxially grown film of monocrystalline Beta-SiC on Alpha-SiC substrate for use in semiconductor devices which will operate at high powers, high frequencies, high radiation densities, and temperatures over 500° C., the method comprising polishing an Alpha-SiC crystal along a basal plane to provide a planar, smooth surface;

oxidizing the polished surface of the Alpha-SiC substrate crystal;

removing the oxidized layer from the substrate crystal;

introducing the substrate crystal into a CVD system and etching the substrate with a flowing stream of hydrogen gas at a temperature sufficient to remove any native oxide layer thereon; and epitaxially depositing a film of Beta-SiC on the basal plane of the substrate by introducing a vaporized, silicon-containing material and a vaporized carbon-containing material into the flowing stream of hydrogen gas, while introducing sufficient energy to insure sufficient decomposition of said silicon- and carbon-containing materials into silicon and carbon species and to insure sufficient surface diffusion of the silicon species and carbon species at the substrate surface to produce monocrystalline growth of Beta-SiC, but said introduced energy being less than the energy required to form Alpha-Sic.

4. A method according to claim 3 wherein the step of removing the oxidized layer from the remainder of the substrate comprises etching the oxidized layer with hydrofluoric acid.

5. A method according to claim 3 wherein the step of introducing vaporized silicon-containing material and vaporized carbon-containing material comprises introducing the materials in conjunction with remote plasma assisted chemical vapor deposition.

6. A method according to claim 3 wherein the step of introducing vaporized silicon-containing material and vaporized carbon-containing material comprises introducing the materials in conjunction with immersed plasma assisted chemical vapor deposition.

7. A method according to claim 3 wherein the step of introducing sufficient energy to insure sufficient surface diffusion comprises introducing laser light of a frequency and energy to insure sufficient diffusion of silicon species and carbon species.

8. A method of epitaxially growing a high purity, low defect, device quality film of monocrystalline Beta-SiC on an Alpha-SiC substrate for use in the fabrication of semiconductor devices which will operate at high powers, high frequencies, high radiation densities and at temperatures over 500° C., the method comprising:

providing a 6H SiC substrate crystal having an exposed, planar (0001)C face or (0001)Si face that is prepared to be receptive to epitaxial growth thereon;

introducing the 6H SiC substrate crystal into the growth chamber of a CVD system;

evacuating the growth chamber of the CYD system to a vacuum of at least $10^{-4}$ Torr;

backfilling the CYD chamber with a flowing stream of $H_2$ gas in order to purge the system;

continuing the flow of $H_2$ gas while heating the growth chamber to between about 1400° C. to about 1600° C.;

etching the face of the substrate in the flow of $H_2$ gas for a time sufficient to remove at least a substantial portion of any native oxide layer thereon;

introducing a silicon source gas and a carbon source gas into the $H_2$ stream, while maintaining the temperature in the growth chamber between about 1400° C. to about 1600° C., and maintaining the source gas (silicon source gas+carbon source gas) to carrier gas ($H_2$) ratio at a level sufficient to effect growth of a monocrystalline Beta-SiC film on the substrate.

9. A method according to claim 8 wherein the silicon source gas is $SiH_4$ and the carbon source gas is $C_2H_4$.

10. A method according to claim 9 wherein the purity of the $H_2$ carrier gas exceeds 99.99, the $SiH_4$ source gas contains less than 2 ppm nitrogen impurities and the $C_2H_4$ source gas contains less than 10 ppm nitrogen impurities.

11. A method according to claim 9 wherein the source gas ($SiH_4+C_2H_4$) to carrier gas ($H_2$) ratio is maintained at approximately 1:3000 during film growth.

12. A method according to claim 11 wherein the temperature in the growth chamber is maintained in the range of about 1450° C. to about 1550° C. during film growth.

13. A method according to claim 12 wherein the (0001)C face or (0001)Si face is prepared to be receptive to epitaxial growth by first polishing the face, followed by oxidizing the polished face, followed by etching the face with hydrofluoric acid to remove the oxidized layer.

14. A method according to claim 13 wherein the epitaxial growth is carrier out in cold wall, vertical barrel-type CVD system.

* * * * *

UNITED STATES PATENT AND TRADEMARK OFFICE
CERTIFICATE OF CORRECTION

PATENT NO. : 4,912,063

DATED : March 27, 1990

INVENTOR(S) : Davis et al.

It is certified that error appears in the above-identified patent and that said Letters Patent is hereby corrected as shown below:

Column 1, line 1, in the title, delete "BETA-SIC" and insert --BETA-SiC--.
Column 2, line 65, delete "CYD" and insert --CVD--.
Column 2, line 33, delete "(101)" and insert --(10$\bar{1}$)--.
Column 2, line 34, delete "(1120)" and insert --(112$\bar{0}$)--.
Column 2, line 39, delete "(0001)" and insert --(000$\bar{1}$)--.
Column 3, line 7, delete "(0001)" and insert --(000$\bar{1}$)--.
Column 3, line 19, delete "[1120]" and insert --[11$\bar{2}$0]--.
Column 3, line 21, delete "[101]" and insert --[10$\bar{1}$]--.
Column 3, line 27, delete "[111]" and insert --[11$\bar{1}$]--.
Column 4, line 26, delete "(0001)" and insert --(000$\bar{1}$)--.
Column 4, line 35, delete "CYD" and insert --CVD--.
Column 4, line 46, delete "CYD" and insert --CVD--.
Column 4, line 57, delete "CYD" and insert --CVD--.
Column 5, line 67, delete "(0001)" and insert --(000$\bar{1}$)--. (1st occurrence)
Column 6, line 6, delete "(0001)" and insert --(000$\bar{1}$)--.
Column 6, line 21, delete "Y" and insert --V--.
Column 6, line 37, delete "(0001)" and insert --(000$\bar{1}$)--.
Column 6, line 42, delete "(0001)" and insert --(000$\bar{1}$)--.
Column 6, line 55, after "pyramids" insert --.--.
Column 7, line 23, delete "(0001) and insert --(000$\bar{1}$)
Column 7, line 28, delete "[1120]" and insert --[11$\bar{2}$0]--.
Column 7, line 28, after "pole" insert --.--.
Column 7, line 31, delete "(101)" and insert --(10$\bar{1}$)--.
Column 7, line 32, delete "(1120)" and insert --(11$\bar{2}$0)--.
Column 7, line 54, delete [111] and insert --[$\bar{1}$11]--.
Column 8, line 35, after "Profiler" insert --.--.
Column 4, line. 47, delete "CYD" and insert --CVD--
Column 7, line 27, delete [101] and insert --[10$\bar{1}$]--

UNITED STATES PATENT AND TRADEMARK OFFICE
CERTIFICATE OF CORRECTION

PATENT NO. : 4,912,063

DATED : March 27, 1990

INVENTOR(S) : Davis et al.

Page 2 of 2

It is certified that error appears in the above-identified patent and that said Letters Patent is hereby corrected as shown below:

Column 9, line 59, after the first occurrence of "the" insert --[111]--.
Column 9, line 63, delete "(101)" and insert --(10$\bar{1}$)--.
Column 9, line 64, delete "(1120) and insert --(11$\bar{2}$0)--.
Column 10, line 29, after the first occurrence of "the" insert [$\bar{1}\bar{1}\bar{1}$].
Column 10, line 32, delete "(0001)" and insert --(000$\bar{1}$)--.
Column 10, line 34, delete "(1120)" and insert (11$\bar{2}$0)--.
Column 11, line 38, delete "(0001)" and insert --(000$\bar{1}$)--.
Column 12, lines 1 and 3, delete "CYD" and insert --C$\bar{V}$D--.
Column 12, line 34, delete "(0001)" and insert --(000$\bar{1}$)--.
Column 10, line 27, delete "(0001)" and insert --(000$\bar{1}$)--.
Column 10, line 29, delete "(0001)" and insert --($\bar{0}\bar{0}0\bar{1}$)--.
Column 10, line 30, delete "(111)" and insert --($\bar{1}\bar{1}\bar{1}$)--.

Signed and Sealed this

Fourteenth Day of July, 1992

Attest:

DOUGLAS B. COMER

*Attesting Officer*       *Acting Commissioner of Patents and Trademarks*

UNITED STATES PATENT AND TRADEMARK OFFICE
CERTIFICATE OF CORRECTION

PATENT NO. : 4,912,063
DATED : March 27, 1990
INVENTOR(S) : Robert F. Davis et al.

It is certified that error appears in the above-identified patent and that said Letters Patent is hereby corrected as shown below:

Column 1,
Line 5, before the "FIELD OF THE INVENTION" paragraph please insert the following:
-- The U.S. Government has a paid-up license in this invention and the right in limited circumstances to require the patent owner to license others on reasonable terms as provided for by the terms of contract N00014-82-K-0182 awarded by the Office of Naval Reserch. --

Signed and Sealed this

Fifteenth Day of March, 2005

JON W. DUDAS
*Director of the United States Patent and Trademark Office*